United States Patent
Carter, Jr. et al.

(10) Patent No.: US 7,811,943 B2
(45) Date of Patent: Oct. 12, 2010

(54) PROCESS FOR PRODUCING SILICON CARBIDE CRYSTALS HAVING INCREASED MINORITY CARRIER LIFETIMES

(75) Inventors: Calvin H. Carter, Jr., Durham, NC (US); Jason R. Jenny, Wake Forest, NC (US); David P. Malta, Raleigh, NC (US); Hudson M. Hobgood, Pittsboro, NC (US); Valeri F. Tsvetkov, Durham, NC (US); Mrinal K. Das, Durham, NC (US)

(73) Assignee: Cree, Inc., Durham, NC (US)

( * ) Notice: Subject to any disclaimer, the term of this patent is extended or adjusted under 35 U.S.C. 154(b) by 590 days.

(21) Appl. No.: 11/052,679

(22) Filed: Feb. 7, 2005

(65) Prior Publication Data

US 2006/0130742 A1 Jun. 22, 2006

Related U.S. Application Data

(60) Provisional application No. 60/639,154, filed on Dec. 22, 2004.

(51) Int. Cl.
*H01L 21/31* (2006.01)
(52) U.S. Cl. ............... 438/758; 438/478; 257/E33.035; 257/E21.054; 257/E21.459; 257/E21.602; 257/E21.605; 257/E21.699
(58) Field of Classification Search .......... 257/E33.035, 257/E21.054, E31.459, E21.603, E21.695, 257/E21.699; 438/478, 758
See application file for complete search history.

(56) References Cited

U.S. PATENT DOCUMENTS

| 4,135,951 | A | 1/1979 | Stone |
| 4,247,859 | A | 1/1981 | Rai-Choudhury et al. |
| 4,866,005 | A | 9/1989 | Davis et al. |
| 5,061,972 | A | 10/1991 | Edmond |
| RE34,861 | E | 2/1995 | Davis et al. |
| 5,704,985 | A | 1/1998 | Kordina et al. |
| 5,993,770 | A * | 11/1999 | Kuroyanagi et al. ........ 423/345 |
| 6,303,475 | B1 | 10/2001 | Suvorov et al. |
| 6,346,821 | B1 | 2/2002 | Baumgart |
| 6,358,825 | B1 | 3/2002 | Hao et al. |
| 6,369,603 | B1 | 4/2002 | Johnston et al. |
| 6,814,801 | B2 | 11/2004 | Jenny et al. |
| 6,974,720 | B2 | 12/2005 | Sumakeris et al. |
| 2003/0079676 | A1 * | 5/2003 | Ellison et al. ................. 117/88 |
| 2003/0233975 | A1 | 12/2003 | Jenny et al. |
| 2005/0082542 | A1 | 4/2005 | Sumakeris et al. |

(Continued)

OTHER PUBLICATIONS

Kordina et al., "The minority carrier lifetime of n-type 4H- and 6H-SiC epitaxial layers," Applied Physics Lett., vol. 69, No. 5, Jul. 29, 1996, pp. 679-681.

(Continued)

*Primary Examiner*—Davienne Monbleau
*Assistant Examiner*—Matthew Reames
(74) *Attorney, Agent, or Firm*—Steven B. Phillips; Moore & Van Allen PLLC

(57) ABSTRACT

A process is described for producing silicon carbide crystals having increased minority carrier lifetimes. The process includes the steps of heating and slowly cooling a silicon carbide crystal having a first concentration of minority carrier recombination centers such that the resultant concentration of minority carrier recombination centers is lower than the first concentration.

45 Claims, 7 Drawing Sheets

U.S. PATENT DOCUMENTS

2006/0137600 A1* 6/2006 Ellison et al. ................ 117/19

OTHER PUBLICATIONS

Ballandovich V. S. et al, "Influence of annealing on the diffusion length of the minority carriers in n-type SiC (6H)," Soviet Physics—Semiconductors USA, vol. 15, No. 8, Aug. 1981, pp. 959-960.

International Search Report for International Application No. PCT/US2005/036226, mailed Apr. 10, 2006.
ASTM International Test No. F978-02, "Standard Test Method for Characterizing Semiconductor Deep Levels By Transient Capacitance Techniques." May 2003.
Patent Cooperation Treaty, International Preliminary Report on Patentability, dated Mar. 14, 2007.
EP Article 94(3) Examination Report, dated Apr. 29, 2010.

* cited by examiner

PROCESS FOR PRODUCING SILICON CARBIDE CRYSTALS HAVING INCREASED MINORITY CARRIER LIFETIMES

CROSS-REFERENCE TO RELATED APPLICATIONS

This application claims priority from provisional application Ser. No. 60/639,154 filed Dec. 22, 2004, which is hereby incorporated entirely herein by reference.

STATEMENT OF GOVERNMENT INTEREST

This invention was developed under ONR Contract No. N00014-02-C-0302. The government may have certain rights in this invention.

BACKGROUND OF THE INVENTION

The present invention relates to a process for the production of silicon carbide crystals and more particularly to the production of silicon carbide crystals having increased minority carrier lifetimes.

Semiconductor devices are increasingly required to accommodate high currents and/or high voltages without failing. Many high power applications call for the use of a semiconductor switch which is required to conduct a large current when turned on, and to block a high voltage when off. Although silicon (Si) has been the material of choice for many semiconductor applications, its fundamental electronic structure and characteristics prevent its utilization beyond certain parameters. Thus, interest for power devices has turned from silicon to other materials, including silicon carbide (SiC).

Silicon carbide has a variety of physical and electronic properties useful in semiconductor devices, including a wide bandgap, a high thermal conductivity, a low dielectric constant, high temperature stability, and high electric field breakdown. As a result, silicon carbide materials should theoretically allow production of electronic devices that can operate at higher temperatures, higher power and higher frequency than devices produced from silicon.

As an example, the wider bandgap of SiC as compared to silicon gives SiC a "critical electric field," i.e., the peak electric field that a material can withstand without breaking down, which is an order of magnitude higher than that of silicon. This allows much higher doping and a much thinner drift layer for a given blocking voltage, resulting in a very low specific on-resistance in SiC-based devices. Although it has a much higher breakdown field than silicon, SiC has lower hole and electron mobilities and shorter minority carrier lifetimes, which can detrimentally affect the blocking voltage for a device as voltages increase.

Traditionally, two broad categories of techniques have been used for forming crystalline silicon carbide for semiconductor applications. One of these techniques epitaxially grows silicon carbide crystals by introducing suitable reactant gases into a system to form silicon carbide crystals upon an appropriate substrate. Epitaxially grown SiC crystals generally can exhibit minority carrier lifetimes suitable for various power device applications. As operating voltage demands for such power devices increase, for example, approaching 10 kilovolts (kV) and higher, the devices require increasingly thick silicon carbide layers to provide the requisite blocking voltage to prevent device failure. The production of suitably thick epitaxially grown SiC crystals, however, is not currently cost effective. Moreover, it can be undesirably time consuming to manufacture such crystals.

The other primary technique for the manufacture of SiC materials is sublimation growth, also referred to as physical vapor transport (PVT), in which a silicon carbide source material (typically a powder) is used as a starting material. The silicon carbide starting material is heated in a crucible until it sublimes. The sublimed material is encouraged to condense to produce the desired crystals. This can be accomplished by introducing a silicon carbide seed crystal into the crucible and heating it to a temperature less than the temperature of the source material. A pioneering patent that describes methods for forming crystalline silicon carbide for semiconductor applications using such seeded sublimation techniques is U.S. Pat. No. 4,866,005 to Davis et al., issued Sep. 12, 1989, which was reissued as U.S. Pat. No. Re. 34,861, issued Feb. 14, 1995, which patents are incorporated herein by reference as if set forth in their entirety.

Manufacturing SiC crystals using seeded sublimation techniques can offer cost and time advantages as compared to epitaxially growing SiC. As noted above, however, bulk SiC single crystals can have relatively short minority carrier lifetimes. As such, these materials typically are less suitable for use in certain applications, including power devices.

Thus there exists a need to produce silicon carbide crystals having increased minority carrier lifetimes, in a cost effective and time efficient manner, to facilitate large scale production of semiconductor devices including such materials

BRIEF SUMMARY OF THE INVENTION

The present invention includes a process for producing silicon carbide crystals having increased minority carrier lifetimes. The process of the invention controllably decreases the number of intrinsic defects and resulting deep level states present in the silicon carbide crystal, as compared to an "as-grown" silicon carbide crystal. Deep level states can act as minority carrier recombination centers in semiconductor materials. The inventors have found that decreasing the concentration of minority carrier recombination centers in the crystal by the process of the invention can result in a material with increased minority carrier lifetimes.

The invention includes the step of heating a silicon carbide crystal having a first concentration of minority carrier recombination centers. Generally, the heating step includes heating the crystal to a temperature greater than its growth temperature for up to about one hour in an inert ambient atmosphere. Advantageously, the crystal is heated to a temperature ranging from about 2400° C. to about 2700° C., and most advantageously to a temperature of about 2600° C.

The heated crystal is thereafter cooled at a rate sufficiently slow to result in a concentration of minority carrier recombination centers in the cooled crystal that is lower than the first concentration. The cooling step can include, for example, cooling the heated silicon carbide crystal at a rate of about 2° C. per minute or less to a temperature of about 1400° C. to about 1000° C., and advantageously about 1200° C., and then cooling to room temperature at a rate from about 2° C. per minute to about 10° C. per minute. Although not wishing to be bound by any explanation or theory of the invention, the inventors currently believe that heating and slowly cooling the crystal in this manner can eliminate at least a portion of minority carrier recombination centers present in the crystal. The present invention also includes silicon carbide crystals made in accordance with this process. The resultant silicon carbide crystal, and in particular bulk silicon carbide single crystals produced by sublimation techniques, can exhibit increased minority carrier lifetimes as compared to "as-grown" crystals. The crystals of the invention can, for example, exhibit minority carrier lifetimes of at least about 1 microseconds, at least about 4 microseconds, and even at least about 30 microseconds, and higher.

The present invention further includes processes for the production of semiconductor devices, such as power devices, that include a silicon carbide crystal exhibiting increased minority carrier lifetimes. The present invention also includes devices including the resultant silicon carbide crystal as at least one component thereof, such as described in commonly assigned U.S. Pat. No. 6,974,720, titled "Methods for Forming Power Semiconductor Devices Using Boule-Grown Silicon Carbide Drift Layers and Power Semiconductor Devices Formed Thereby," granted Dec. 13, 2005, which is incorporated herein by reference.

BRIEF DESCRIPTION OF THE DRAWINGS

Figure 1A:
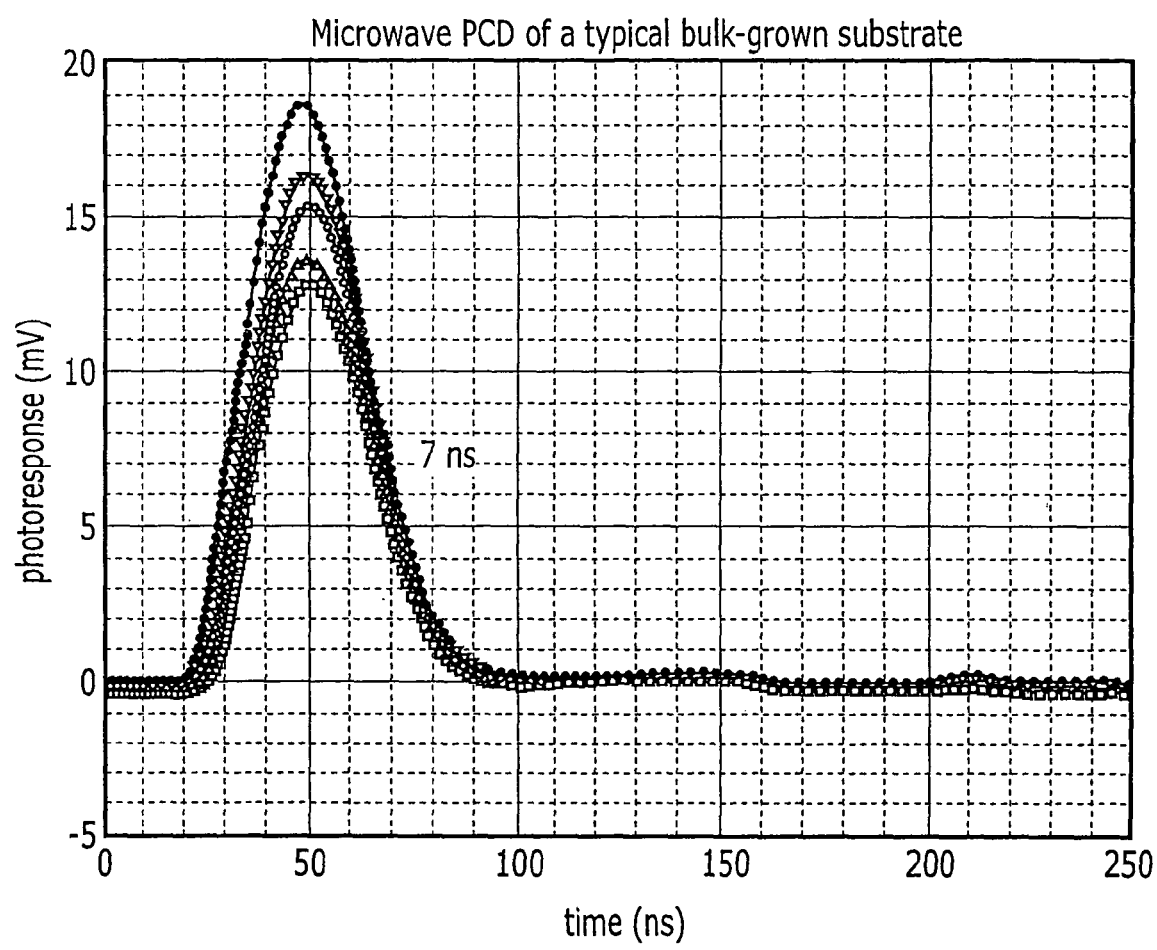
Figure 1B:
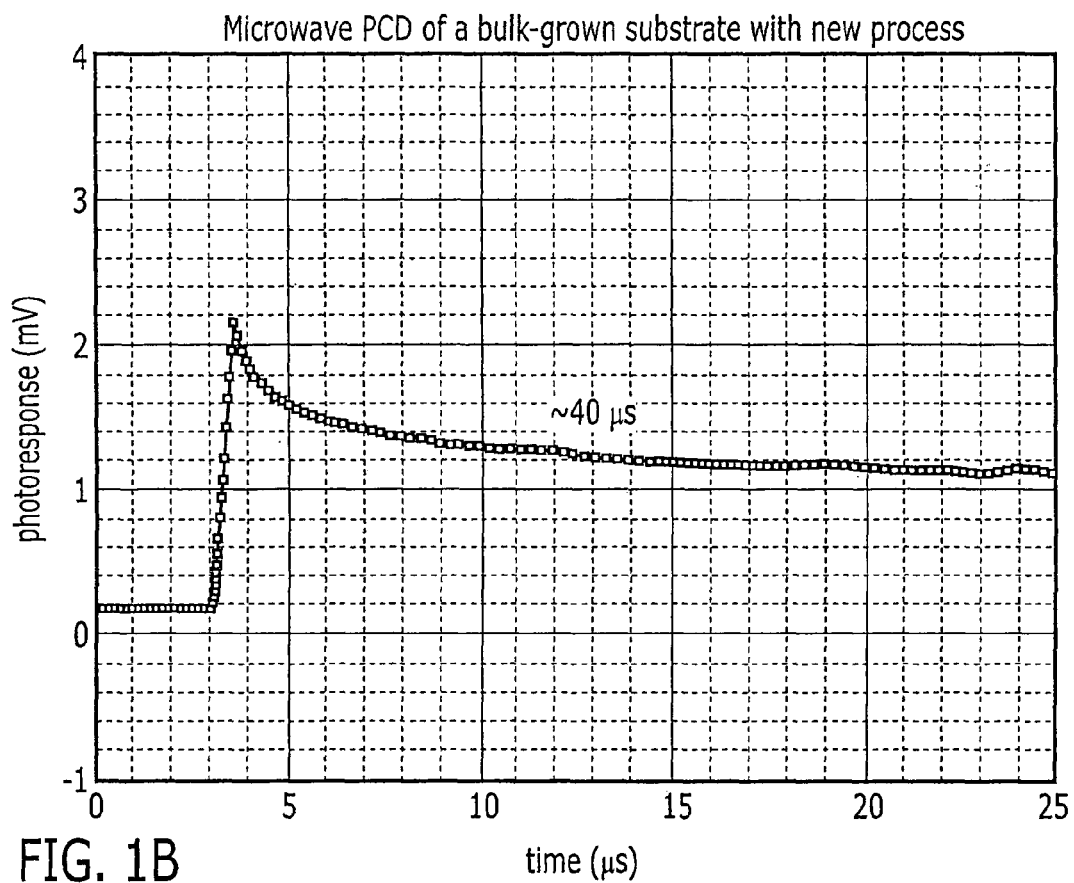
Figure 2:
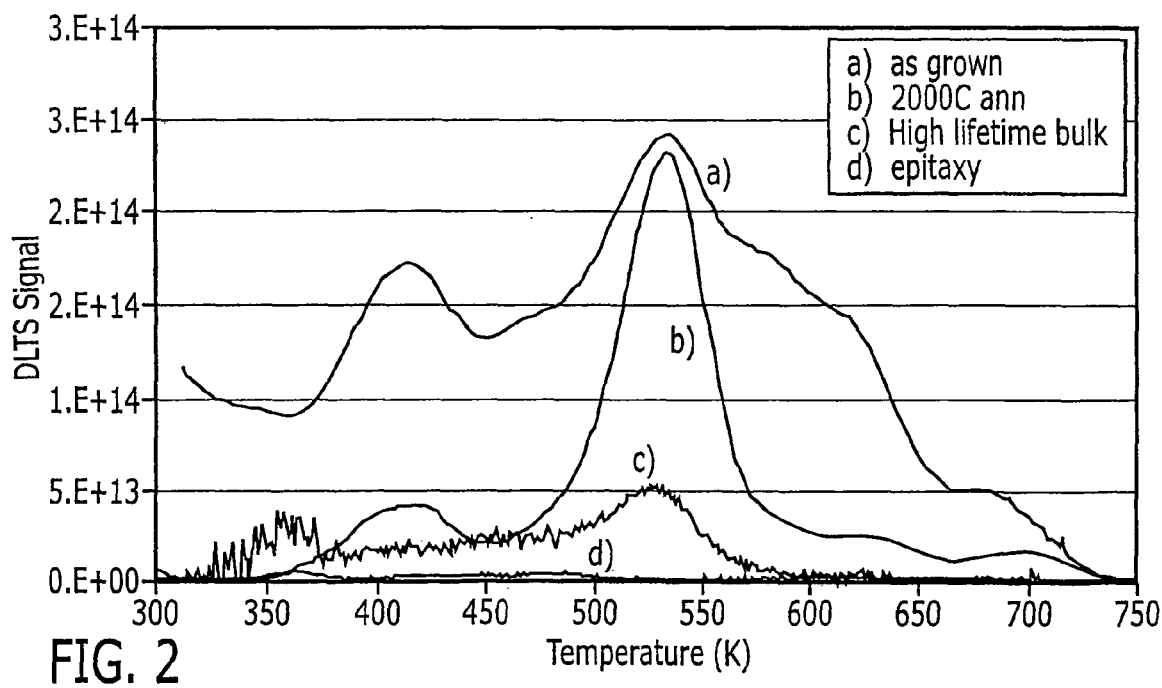
Figure 3:
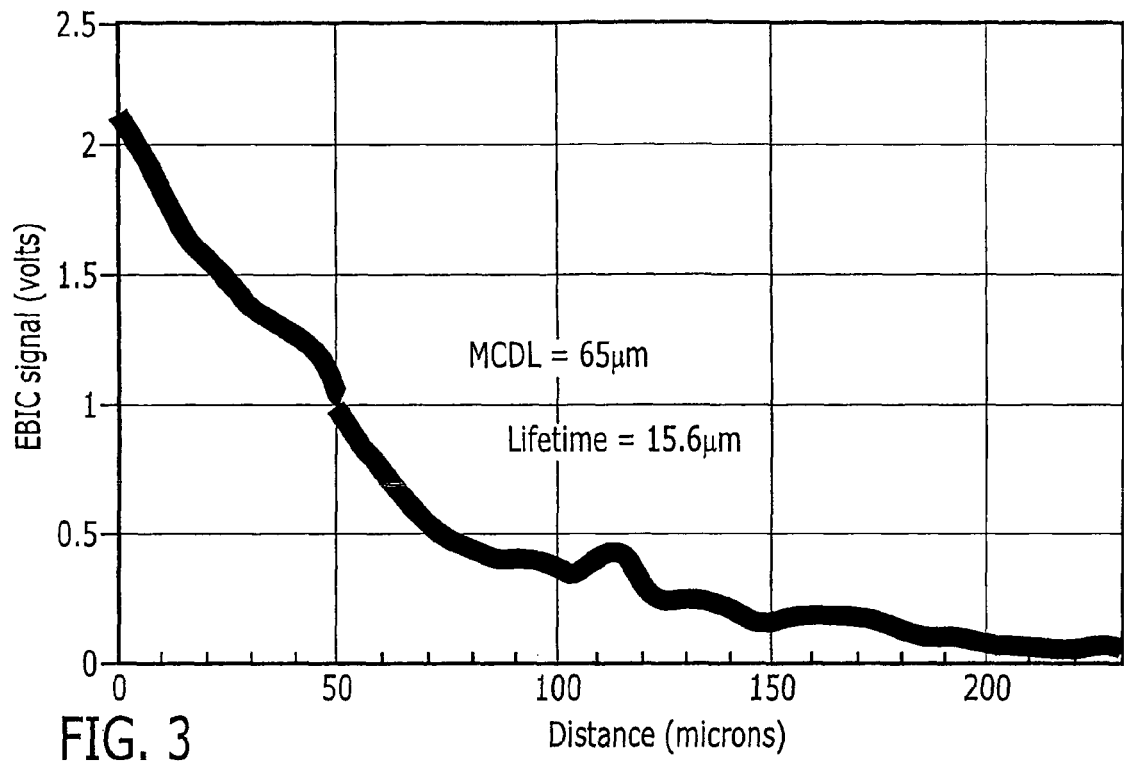
Figure 4:
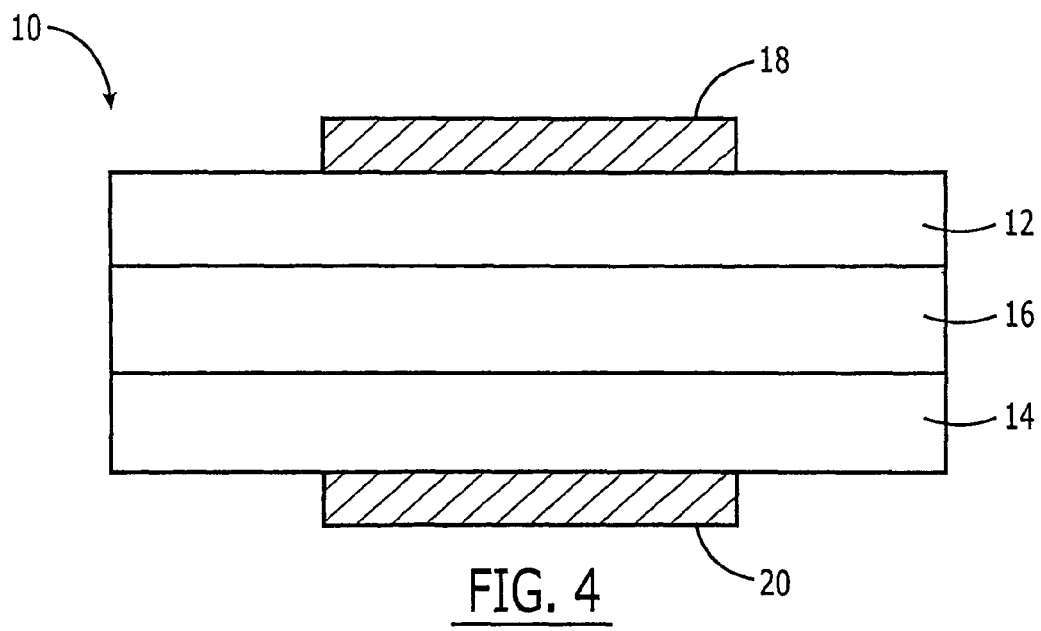
Figure 5:
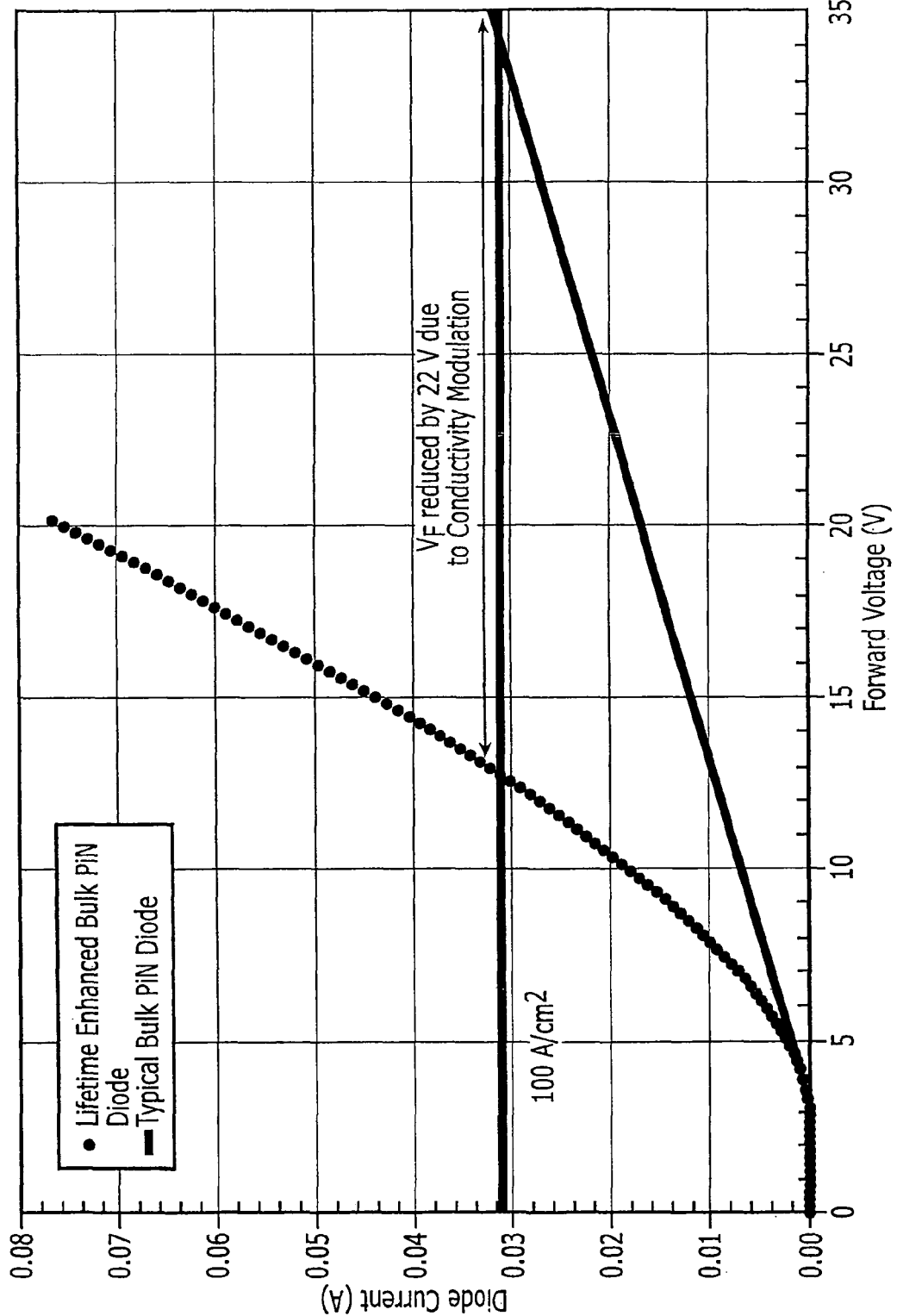
Figure 6:
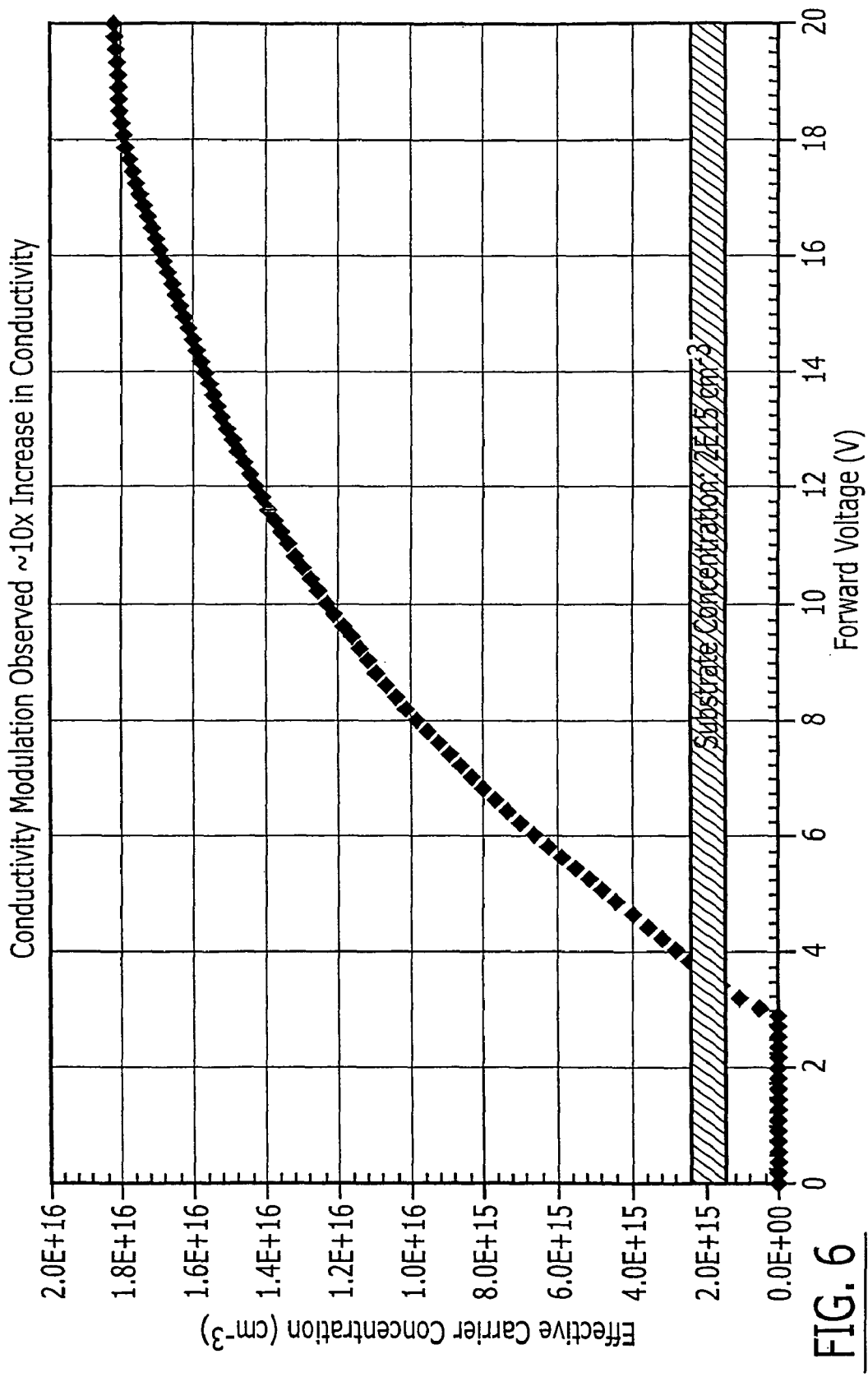
Figure 7:
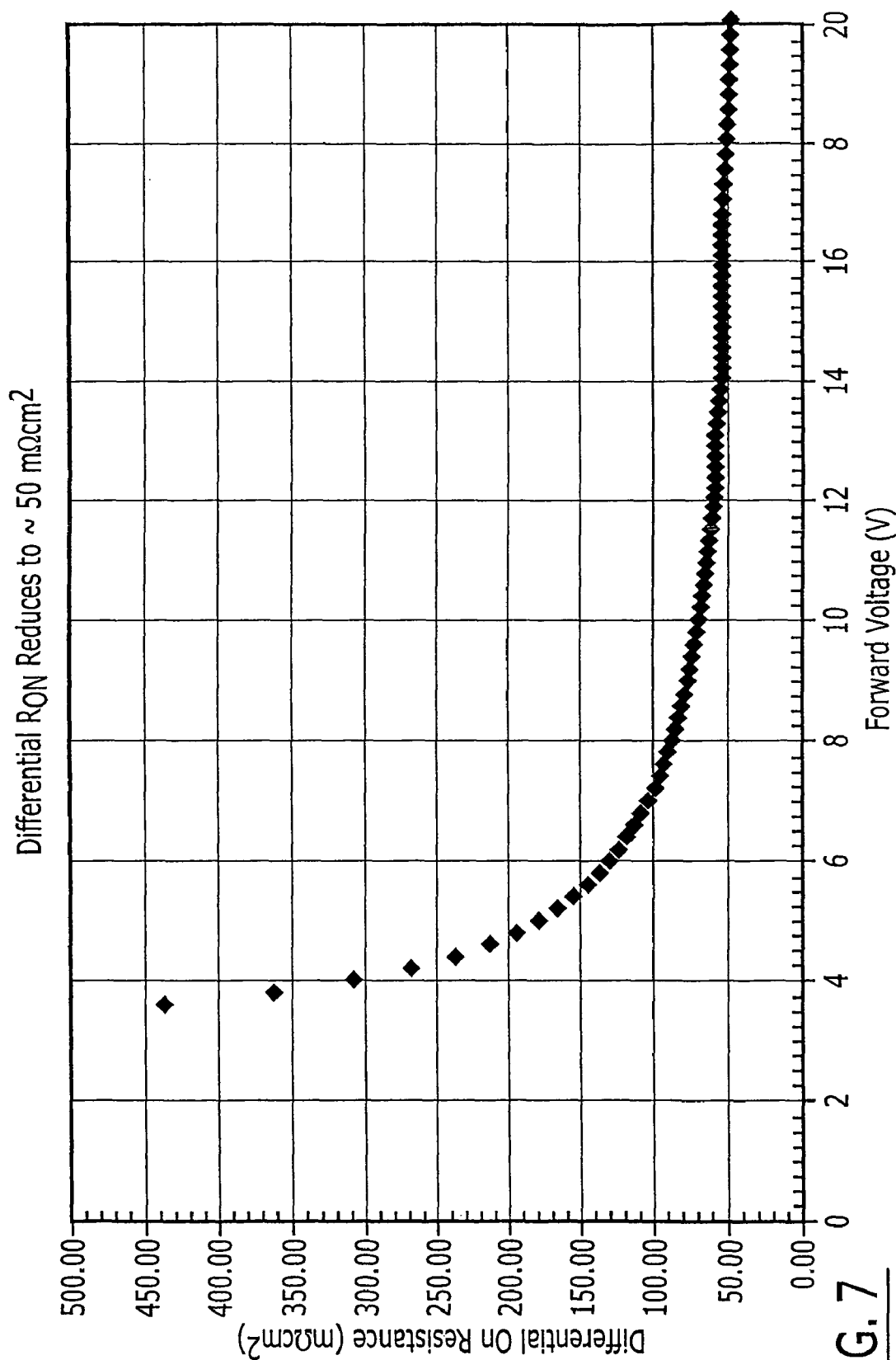
Figure 8:
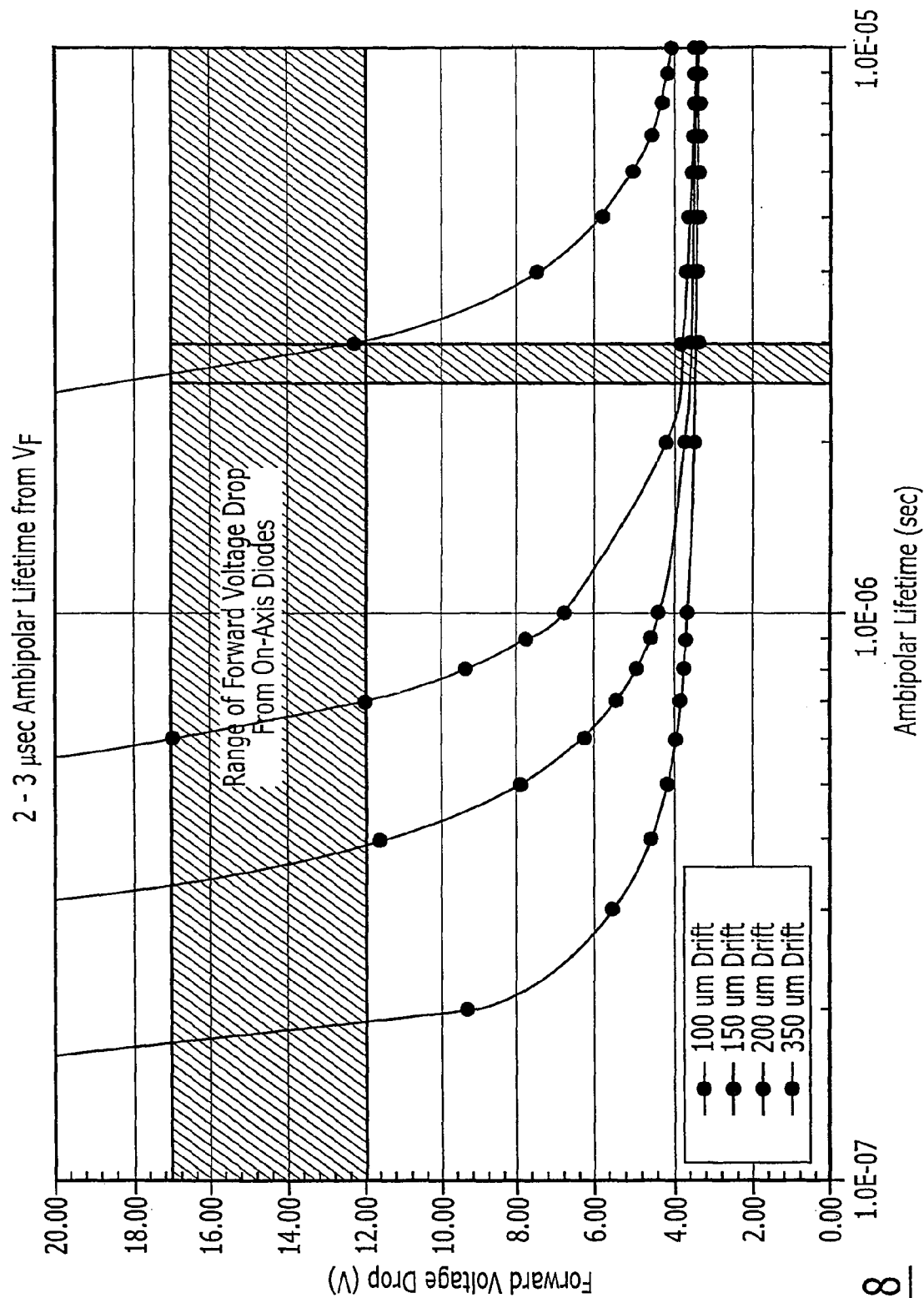

Having thus described the invention in general terms, reference will now be made to the accompanying drawings, which are not necessarily drawn to scale, and in which:

FIGS. 1A and 1B are graphs illustrating microwave photoconductive decay (PCD) rates of a conventional as-grown silicon carbide material (FIG. 1A) and of a silicon carbide material treated in accordance with the present invention (FIG. 1B);

FIG. 2 is a graph illustrating decreased deep level states present in a silicon carbide crystal treated in accordance with the present invention, as determined using deep level transient spectroscopy (DLTS);

FIG. 3 is a graph illustrating increased minority carrier diffusion length and hence improved carrier lifetime present in a silicon carbide crystal treated in accordance with the present invention, as demonstrated using electron beam induced current (EBIC) analysis;

FIG. 4 is a schematic cross sectional view of a PiN diode including a silicon carbide material treated in accordance with the present invention;

FIG. 5 is a graph illustrating reduced forward voltage drop exhibited by a PiN diode including a lifetime-enhanced bulk SiC substrate prepared in accordance with the present invention as the drift layer;

FIG. 6 is a graph illustrating increased conductivity modulation in the PiN diode from FIG. 5 that includes a lifetime-enhanced bulk SiC substrate prepared in accordance with the present invention;

FIG. 7 is a graph illustrating reduced differential on-resistance with increasing forward voltage for the PiN diode from FIG. 5 that includes a lifetime-enhanced bulk SiC substrate prepared in accordance with the present invention; and FIG. 8 is a graph illustrating ambipolar carrier lifetime extracted from the forward voltage observed in the PiN diode from FIG. 5 that includes a lifetime-enhanced bulk SiC substrate prepared in accordance with the present invention.

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

As used herein and as understood in the art, the term "minority carrier recombination centers" refers to recombination centers that form in a silicon carbide crystal during the growth process owing to the presence of intrinsic defects or associations thereof. Intrinsic defects can occur in bulk grown and epitaxially grown silicon carbide materials. Intrinsic defects are also referred to in the art as "point defects" and include all defects that contain at least one intrinsic component, for example, interstitials, vacancies, anti-sites, and complexes of these with one another and with residual impurities.

Also as used herein, the term "crystal" includes boules, bulk single crystals, wafers, substrates, and epitaxial layers, including not limited to layers produced by CVD, HTCVD, LPE, and halide CVD techniques.

The process of the invention includes heating a silicon carbide crystal having a first concentration of minority carrier recombination centers to an elevated temperature. Generally, the silicon carbide crystal is heated to a temperature that is greater than the temperature at which the crystal is grown. As an example, the crystal can be heated to a temperature higher than the temperature required for epitaxial growth of silicon carbide from suitable source gases. As another example, the crystal can be heated to a temperature higher than the temperature required for silicon carbide sublimation to occur under typical PVT growth conditions.

The process of the invention then includes cooling the heated crystal, generally to a temperature approaching room temperature, at a rate sufficiently slow so as to reduce the concentration of minority carrier recombination centers in the cooled crystal so that they are lower than the first concentration. Stated differently, the process includes the step of cooling the heated crystal to approach room temperature at a sufficiently slow rate so as to increase the time spent in a temperature range in which the defects (including those created by the heating step) are sufficiently mobile to be re-annealed into the crystal to thereby produce a silicon carbide crystal with a concentration of point defect-related deep level states that is less than the concentration of such states in an otherwise identically grown silicon carbide crystal that has not been heated and cooled in this manner.

In this way, the present invention sufficiently reduces the concentration of minority carrier recombination centers in the silicon carbide so that the concentration remaining after normal semiconductor processing and device manufacture results in a material exhibiting the desired increased minority carrier lifetimes. Those familiar with the nature of silicon carbide will recognize that there is no specific number or concentration of minority carrier recombination centers that meets this requirement. Instead, the goal is to minimize the concentration of minority carrier recombination centers in the SiC lattice to thereby increase minority carrier lifetimes of the resultant material.

The starting crystals are advantageously of high purity and can be produced by a seeded sublimation technique such as is set forth in U.S. Pat. No. RE34,861 (reissued from U.S. Pat. No. 4,866,005). Alternatively, the starting crystals can be epitaxial layers produced by epitaxial growth such as known in the art. As used herein, the term "high purity" refers to a starting silicon carbide crystal having relatively low levels of dopants, such as starting silicon carbide crystals with a concentration of dopants of less than about $1E17 (1\times10^{17})$ cm$^{-3}$.

Advantageously, when the crystal is in the form of a bulk grown silicon carbide single crystal, the crystal is heated to a temperature of at least about 2400° C., for example from about 2400° C. to about 2700° C., and advantageously about 2600° C., at atmospheric pressure. Generally, the crystal is not heated to a temperature beyond which the desired properties thereof are substantially compromised or degraded. The upper temperature limit can vary but generally is about 2700° C. when using relatively typical equipment operating at atmospheric pressure. Those having the ordinary skill expected in this field could carry out the heating at higher temperatures without undue experimentation using additional equipment and techniques such as incorporating an overlying silicon and carbon atmosphere or using some other high pressure technique to prevent the compromise of desired crystal properties that can begin to occur in statistically significant amounts at increasingly higher temperatures. As another example, when the crystal is in the form of one or more silicon carbide epitaxial layers, the crystal is also heated to a temperature greater than its growth temperature, for example, above 1600° C., advantageously to within a range from about 1600° C. to about 2700° C., and more advantageously to about 2600° C., so long as the crystal is not heated to a temperature beyond which the desired properties thereof are substantially compromised or degraded.

The purpose of raising the temperature to at least about 2400° C. or greater can be described in thermodynamic terms. Without being bound by any explanation of the present invention, it is currently believed that intrinsic defects and complexes thereof in the as-grown crystal act as recombination centers for minority carriers. It is also currently believed that heating the crystal under these conditions can effectively modify intrinsic defects present in the crystalline structure so that the concentration of minority carrier recombination centers is modified through the breaking of complex defects into smaller, more mobile components. As an example, the crystal can be heated to a temperature sufficiently high to dissociate intrinsic defects and/or complexes of intrinsic defects so that the intrinsic defects are free to migrate within the crystal structure. Properly cooling the heated crystal in accordance with the present invention can minimize or prevent the dissociated defects from recombining. Because the resultant crystal has a lower concentration of intrinsic defects, and accordingly a lower concentration of carrier recombination centers, the crystal can thereby exhibit increased minority carrier lifetimes.

The cooling step is significant because as the crystal is allowed to spend sufficient time in intermediate temperature ranges, such as those above about 1400° C., the crystal is believed to undergo a desired annealing process so that the crystal can reach an equilibrium or near-equilibrium condition in which the intrinsic defect states disappear (or are functionally reduced to a negligible number) as the crystal becomes more ordered. This can be important to achieving the desired properties of the resultant crystal because generally heating the crystal to temperatures sufficient to dissociate defects can also at least initially result in a more disordered crystal structure according to the laws of thermodynamics and an increase in the resultant entropy at these high temperatures. Cooling the heated crystal too quickly can result in a more disordered crystal by freezing the more disordered states in the crystals before the dissociated defects can settle an ordered configuration in the crystal lattice.

During the heating step, the crystal is maintained at the elevated temperature for a time sufficient to obtain the desired thermal equilibrium or near equilibrium in the crystal having the desired number of states. As was mentioned previously, the overall concentration of intrinsic defects likely increases at higher temperatures, but there is also an increased likelihood of breaking complex defects and thereby reducing the concentration of minority carrier recombination centers which would not happen at lower temperatures. It will be understood that the crystal does not need to reach a full equilibrium in the most proper or restricted sense of that term, but the term is used herein to describe a condition in which the crystal reaches a given temperature and is maintained there for a time sufficient to reduce the desired number of defect states. Generally the crystal is maintained at the elevated temperature for a period of at least about one hour.

The crystal can be heated using any suitable apparatus known in the art for heating a silicon carbide crystal, such as an induction heater. When heated in an induction heater, the step of cooling the crystal can include reducing the power to the induction coil. Induction heaters and their method of operation in semiconductor manufacture are generally well understood in the art and can be incorporated according to the invention without undue experimentation. Thus, as the particular induction heater is not critical to the claimed invention, it will not be discussed in detail otherwise herein. Additionally, other types of heating can be used by those of ordinary skill in this art and without undue experimentation.

Once the crystal has been heated for the desired period of time at the temperature selected to provide the desired state of intrinsic defects, it is cooled in a manner that allows the crystal to dwell for a sufficient time period in the desired temperature range at which the defects are mobile enough to disappear or to be re-annealed into an ordered configuration in the crystal lattice. For example, advantageously the crystal is cooled at a rate of about 2° C. per minute or less to a temperature of about 1400° C. to about 1000° C., and advantageously about 1200° C., and then cooled to room temperature at a rate from about 2° per minute to about 10° C. per minute.

It will be understood by those familiar with thermodynamics and the heating and cooling of materials, particularly materials at relatively high temperatures, that the rate of cooling need be neither constant nor exact throughout the entire cooling process. Stated differently, while the crystal is cooling, and particularly while it is cooling within temperature ranges where re-annealing can occur at significant rates, the rate of cooling should desirably be about 2° C. per minute or less. For the usual and well-understood thermodynamic reasons, the heat loss and thus the rate of cooling will tend to be most rapid as the crystal cools from the highest temperatures and will tend to moderate as the crystal approaches and reaches lower temperatures. In particular, once the crystal is cooled below the temperature range in which re-annealing takes place at significant rates, the rate of cooling can become faster without any functional disadvantage. Accordingly, as an individual crystal is cooled, the rate at which it cools can vary within the range noted above while still taking advantage of the process of the invention.

A rate of cooling that is sufficiently slow will allow the crystal to spend a sufficiently long amount of time in the temperature range at which the intrinsic defects will anneal and the crystal become sufficiently ordered to reduce the number of states below the number necessary to provide the desired minority carrier lifetimes. Cooling at an overly-rapid rate can produce a material with a highly disordered crystalline structure, which is undesired for applications of the present invention requiring increased minority carrier lifetimes.

The cooling step of the present invention can include both passive and active steps. As a first step, the power to the heater is reduced. At the relatively high temperatures to which the crystal has been heated, the initial heat loss is a radiation heat loss. As the temperature becomes lower, the mechanisms of conduction and convection cooling become more important. Accordingly, to further encourage and control the cooling rate, the heating chamber can be flooded with an inert gas, typically argon. Additionally, the thermal mass of the crystal and of the materials with which it is placed in contact can be used to help control the cooling rate. Accordingly, the rate of cooling can be controlled by adjusting the power to the induction coil (or to any other relevant heating mechanism well understood in this art such as resistance heating); flowing a cooling gas around and over the silicon carbide crystal; and controlling the thermal mass of the crystal and its surroundings; i.e. such as the use of a heat sink. Because these are thermodynamic conditions, they can be addressed in a number of different ways that are not critical to the claimed invention and can be carried out by those of ordinary skill in this art without undue experimentation.

The invention can be carried out on substrate wafers with or without epitaxial layers grown thereon or single crystal boules. The treated crystal can be subsequently processed to manufacture the desired device, for example, by slicing a silicon carbide wafer from the boule and then depositing one or more additional layers of suitable materials for a given application on the sliced wafer. Alternatively, the process can include the step of slicing the silicon carbide wafer from the single crystal boule, then heating and cooling the sliced wafer as discussed above. The resultant sliced wafer can also be subsequently processed to manufacture the desired device by depositing one or more additional layers of suitable materials for a given application on the sliced wafer. Alternatively, the process can be applied to an epitaxial layer.

The crystal treated in accordance with the process of the present invention can be prepared using any of the techniques known in the art for the production of silicon carbide crystals, including seeded sublimation and chemical vapor deposition. Advantageously, the crystal is produced using seeded sublimation processes.

The general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, descriptions given herein are most appropriately given in a general and schematic sense with the recognition that those persons of skill in this art will be able to carry out the invention based on the disclosures herein without undue experimentation.

Generally, in a sublimation process for the production of bulk silicon carbide single crystals, a single seed crystal of silicon carbide having a desired polytype and a silicon carbide source material are introduced into a sublimation crucible. The silicon carbide source is typically a silicon carbide powder, but other source materials as known in the art may also be used in accordance with invention. In addition, dopants as known in the art may also be introduced into the crucible in accordance with known techniques.

The silicon carbide seed crystal has at least one surface suitable for promoting the growth of silicon carbide crystals. The seed crystal is positioned within the sublimation crucible so that the growth surface is exposed to volatilized silicon carbide source materials to allow condensation of the same on the growth surface in a manner sufficient to promote growth of the desired bulk crystal.

After the seed crystal and silicon carbide source material are introduced into the sublimation crucible, the temperature of the silicon carbide source material is raised to a temperature sufficient for silicon carbide to sublime from the source material. As the temperature of the source material is raised, the temperature of the growth surface of the seed crystal is likewise raised, typically to a temperature approaching the temperature of the source material but lower than the temperature of the source material so as to encourage condensation of the sublimed species from the source material onto the seed crystal. As a non-limiting example, the source material can be heated to a temperature of about 2200° C. to about 2500° C., with the seed crystal being heated to a temperature slightly lower. Temperatures lower or higher than these temperatures can also be useful so long as the reaction conditions are selected to promote the sublimation and condensation of silicon carbide to form the desired silicon carbide crystal. Other process conditions within the crucible can be controlled in accordance with known procedures in the art, including for example, vapor pressures, thermal gradients between the growth surface of the seed crystal and the source material, and the like.

FIGS. 1A and 1B graphically illustrate microwave photoconductive decay (PCD) rates of a conventional silicon carbide substrate material (FIG. 1A) and of a silicon carbide material treated in accordance with the present invention (FIG. 1B). PCD analysis is a well known technique in the art for monitoring conductivity of minority carriers in a semiconductor material such as silicon carbide. PCD analysis includes the steps of shining radiation of a specific wavelength (here a laser with a wavelength of 266 nm) onto a sample material and monitoring the resultant conduction through its response to a microwave field. As illustrated in FIG. 1A, after the laser is removed, residual minority carriers in the bulk grown silicon carbide material rapidly recombine and are eliminated in a relatively short interval, typically less than 10 nanoseconds (ns). In contrast, FIG. 1B illustrates the increased minority carrier lifetimes of the silicon carbide material treated in accordance with the process of the present invention. As illustrated in FIG. 1B, the lifetime of the minority carriers can be extended significantly, up to 30 microseconds (μs), and higher. The inventors have found that the process of the invention can provide bulk silicon carbide single crystals produced by sublimation techniques as described above having a minority carrier lifetime of at least about 1 μs, at least about 4 μs, and even as high as 30 μs, and higher (FIG. 1B).

FIG. 2 evidences the decreased defect levels of silicon carbide materials treated in accordance with the present invention, as determined using deep level transient spectroscopy. Deep level transient spectroscopy (DLTS) is generally well understood in the semiconductor arts and is a sensitive method used to study deep levels in semiconductors. The method is based on the change in capacitance charge of a reversed biased diode when deep levels emit their carriers after they have been charged by a forward bias pulse. The emission rate is temperature dependent and characteristic for each type of defect. Using the temperature dependence of the emission rate, the activation energy of a deep level can be determined. See, e.g. ASTM International Test No. F978-02, "Standard Test Method For Characterizing Semiconductor Deep Levels By Transient Capacitance Techniques."

In FIG. 2, line a) represents a conventional bulk-grown high purity semiconductor silicon carbide material, produced using a seeded sublimation technique as described above. Line b) represents a bulk-grown material, such as that of line a), which is annealed at 2000° C., i.e., at a temperature less than the high temperature treatment of the present invention. Line d) represents a conventional epitaxial silicon carbide crystal. Line c) represents a bulk-grown silicon carbide material, such as that of line a), which is treated in accordance with the present invention.

The height of each plotted line for samples a), b), c), and d) is proportional to the concentration of deep level states in the material. The higher amplitudes of the crystal samples a) and b) at about 500-550 K represent a larger concentration of deep levels as compared to samples c) and d). Because deep level states in the crystal are believed to act as minority carrier recombination centers which decrease minority carrier lifetimes, sample c) of the invention, with reduced deep levels, can exhibit increased minority carrier lifetimes. Of particular interest in this example, line c) illustrates the absence of $Z_1/Z_2$ levels in the silicon carbide material treated in accordance with the present invention, which levels are believed present in samples a) and b) as demonstrated by the increased amplitude of plots a) and b) at the left end of the graph. Again, while not wanting to be bound by any explanation of the invention, the absence of $Z_1/Z_2$ levels in the material of the invention indicates that such levels can be minority carrier lifetime limiting factors in silicon carbide crystals.

FIG. 3 further illustrates the decreased minority carrier recombination centers present in the silicon carbide crystal treated in accordance with the present invention, as demonstrated using electron beam induced current (EBIC) analysis. EBIC analysis is also well known to the skilled artisan. In this example, an electron beam is scanned across a Schottky diode including silicon carbide material treated in accordance with the present invention to generate electron-hole pairs. The generated charges are collected by the diode and the resulting current detected. Any defect that affects the production or recombination of electron-hole pairs will also affect current detected. In this example, the inventors observed a relatively long minority carrier diffusion length (MCDL) of 65 μm, indicating increased minority carrier lifetimes of the material of the device.

The present invention further includes the resultant treated silicon carbide crystal materials, whether in the form of a boule or sliced wafer, as well as devices that incorporate the wafer formed according to the process of the invention. The invention is not limited to use with any particular devices, but can be particularly useful as a component of high voltage or power devices, including diodes, such as p-n diodes, PiN diodes, and other bipolar devices (thyristors, IGBTs, and the like). As known in the art, PiN diodes are three-layer semiconductor diodes including an intrinsic layer separating P-type and N-type layers or regions. Those familiar with semiconductor devices will recognize that this list is neither limiting nor exhaustive. It is, however, illustrative of the advantages provided by the invention described and claimed herein.

FIG. 4 is a schematic cross sectional view of an exemplary PiN diode 10 including silicon carbide treated in accordance with the present invention. The PiN diode 10 includes a p-type layer 12 and n-type later 14, with a low-doped region 16 sandwiched therebetween, referred to as the "intrinsic" or "i" region. The PiN diode 10 further includes two terminals, an anode (+) 18 and a cathode (−) 20.

PiN diodes are widely used for power circuit applications. In operation, a PiN diode is flooded with injected electrons and holes during forward conduction, which lowers resistivity of the undoped intrinsic region 16 during current flow to allow the diode to carry a high current density. As reverse blocking voltages increase, for example beyond 10 kV, it can be problematic, however, to produce devices that exhibit the requisite blocking voltage in reverse operation while exhibiting conductivity modulation, (and low forward voltage) in forward operation and other properties.

The present inventors have found that the application of the present invention for increasing the minority carrier lifetimes of silicon carbide materials used to manufacture one or more layers of a device like the PiN diode 10, such as intrinsic layer 16, can further decrease the specific differential on-resistance of the intrinsic layer, thereby making the layer even more conductive during forward operation of the device.

To demonstrate the carrier lifetime increasing process of the invention set forth herein, a working PiN diode was manufactured using, as the drift layer of the device, a bulk high purity PVT-grown SiC substrate of 4H polytype with n-type doping. The following procedure was utilized: a single crystal boule typically exhibiting a lifetime of 10 ns or less, as illustrated in FIG. 1A, was subjected to the carrier lifetime increasing process described herein. A substrate of 300 micron thickness derived from a crystal so processed exhibited a lifetime of >20 μsec as shown in FIG. 1B.

The substrate was then incorporated as the drift layer of a PiN diode (16 of FIG. 4). After device fabrication the forward characteristics of the device were determined, as shown in FIG. 5 (dotted curve). Also shown for comparison is the forward characteristic of a PiN diode using the typical as-grown substrate without the lifetime enhancement treatment of the present invention (solid curve). The non-linearity of the lifetime-enhanced diode current vs. forward voltage curve demonstrates that conductivity modulation occurs in the lifetime enhanced PiN diode thereby reducing the operating forward voltage (at 100 A/cm$^2$) by 22 V from 34.6 V to 12.6 V.

FIG. 6 shows that the conductivity modulation observed in the lifetime enhanced device amounts to an increase in the effective carrier concentration of approximately one order of magnitude above the background carrier density, as the forward voltage is increased. To the inventors' knowledge this is the first demonstration of a working PiN diode including a bulk SiC substrate as the drift layer of the device. The differential on-resistance of the device (which is the curvature of the forward I-V characteristic) saturates at a value of approximately 50 mΩcm$^2$, as shown in FIG. 7.

From the forward I-V characteristic (dotted curve FIG. 5) it is possible to extract the ambipolar lifetime for carriers in the device. Within the forward voltage range of the measured devices (12 V to 16 V), an ambipolar lifetime of 2 to 3 μsecs is determined for the carrier lifetime in the working device, as shown in FIG. 8. This extracted value of carrier lifetime in the working PiN device validates the improved carrier lifetime in the bulk SiC substrate drift layer, derived from the lifetime improving process taught herein.

In the drawings and specification there has been set forth a preferred embodiment of the invention, and although specific terms have been employed, they are used in a generic and descriptive sense only and not for purposes of limitation, the scope of the invention being defined in the claims.

That which is claimed is:

1. A process for producing silicon carbide crystals having increased minority carrier lifetimes, comprising:

growing at a growth temperature to form a silicon carbide crystal having a first concentration of minority carrier recombination centers resulting in a first minority carrier lifetime;

heating said silicon carbide crystal to a temperature greater than its growth temperature to dissociate at least some of said recombination centers to decrease the concentration thereof; and thereafter cooling the heated silicon carbide crystal at a rate sufficiently slow to reduce the recombination of said dissociated recombination centers to provide a silicon carbide crystal having a second concentration of minority carrier recombination centers that is lower than the first concentration thereby providing a material having an increased minority carrier lifetime.

2. The process of claim 1, wherein the heating step comprises heating the silicon carbide crystal to a temperature of at least about 2400° C. and wherein the process further comprises maintaining said heated silicon carbide crystal at a temperature of at least about 2400° C. for up to about one hour in an inert ambient atmosphere.

3. The process of claim 2, wherein the heating step comprises heating the silicon carbide crystal to a temperature ranging from about 2400° C. to about 2700° C. and wherein the process further comprises maintaining said heated silicon carbide crystal at a temperature ranging from about 2400° C. to about 2700° C. for up to about one hour in an inert ambient atmosphere.

4. The process of claim 3, wherein the heating step comprises heating the silicon carbide crystal to a temperature of about 2600° C. and wherein the process further comprises maintaining said heated silicon carbide crystal at a temperature of about 2600° C. for up to about one hour in an inert ambient atmosphere.

5. The process of claim 2, wherein the cooling step comprises cooling the heated silicon carbide crystal at a rate of about 2° C. per minute or less to a temperature of about 1400° C. to about 1000° C.

6. The process of claim 5, wherein the cooling step comprises cooling the heated silicon carbide crystal at a rate of about 2° C. per minute or less to a temperature of about 1200° C.

7. The process of claim 6, wherein the cooling step further comprises cooling the silicon carbide crystal from about 1200° C. to about room temperature at a rate from about 2° C. per minute to about 10° C. per minute.

8. The process of claim 1, wherein the growing step comprises forming the silicon carbide crystal by a sublimation process to form a bulk silicon carbide single crystal prior to said heating step and wherein the heating step comprises heating the bulk silicon carbide single crystal.

9. The process of claim 1, wherein the growing step comprises forming the silicon carbide crystal by an epitaxial growth process to form an epitaxial silicon carbide layer or layer prior to said heating step and wherein the heating step comprises heating the epitaxial silicon carbide layer or layers.

10. The process of claim 1, wherein the heating step comprises heating a silicon carbide crystal comprising dopant in an amount of about $1 \times 10^{17} cm^{-3}$ or less.

11. The process of claim 1, wherein the heating and cooling steps comprise heating and cooling a silicon carbide crystal under conditions sufficient to provide a silicon carbide crystal exhibiting a minority carrier lifetime of at least about 1 microseconds (µs) or greater.

12. The process of claim 11, wherein the heating and cooling steps comprise heating and cooling a silicon carbide crystal under conditions sufficient to provide a silicon carbide crystal exhibiting a minority carrier lifetime of at least about 4 microseconds (µs) or greater.

13. A process for producing silicon carbide crystals having increased minority carrier lifetimes, comprising:
heating a silicon carbide crystal having a first concentration of minority carrier recombination centers resulting in a first minority carrier lifetime and thereafter cooling the heated silicon carbide crystal at a rate sufficiently slow to provide a silicon carbide crystal having a second concentration of minority carrier recombination centers that is lower than the first concentration thereby providing a material having an increased minority carrier lifetime, wherein the heating and cooling steps comprise heating and cooling a silicon carbide crystal under conditions to provide a silicon carbide crystal exhibiting a minority carrier lifetime of at least about 30 microseconds (µs).

14. A silicon carbide crystal made by the process of claim 1.

15. A semiconductor device comprising a silicon carbide crystal made by the process of claim 1.

16. The device of claim 15, wherein said device is a power device.

17. The device of claim 15, wherein said device is selected from the group consisting of pn diodes, PiN diodes, thyristors, and IGBTs.

18. A process for the production of a device comprising a silicon carbide crystal exhibiting increased minority carrier lifetime, comprising:
growing at a growth temperature to form a silicon carbide crystal having a first concentration of minority carrier recombination centers resulting in a first minority carrier lifetime;
heating said silicon carbide crystal to a temperature greater than its growth temperature to dissociate at least some of said recombination centers to decrease the concentration thereof;
thereafter cooling the heated silicon carbide crystal at a rate sufficiently slow to reduce the recombination of said dissociated recombination centers to provide a silicon carbide crystal having a second concentration of minority carrier recombination centers that is lower than the first concentration thereby providing a material having an increased minority carrier lifetime; and
incorporating said silicon carbide crystal into a device.

19. The process of claim 18, wherein the incorporating step comprises incorporating said silicon carbide crystal into a device after said heating and cooling steps.

20. The process of claim 18, wherein the incorporating step comprises incorporating said silicon carbide crystal into a power device.

21. The process of claim 20, wherein the incorporating step comprises incorporating said silicon carbide crystal into a p-n diode.

22. The process of claim 20, wherein the incorporating step comprises incorporating said silicon carbide crystal into a PiN diode.

23. The process of claim 1, wherein the cooling step comprises cooling the silicon carbide crystal at a rate of about 2° C. per minute or less.

24. The process of claim 18, wherein the cooling step comprises cooling the silicon carbide crystal at a rate of about 2 ° C. per minute or less.

25. The process of claim 18, wherein the heating step comprises heating the silicon carbide crystal to a temperature of at least about 2400° C. and wherein the process further comprises maintaining said heated silicon carbide crystal at a temperature of at least about 2400° C. for up to about one hour in an inert ambient atmosphere.

26. The process of claim 25, wherein the heating step comprises heating the silicon carbide crystal to a temperature ranging from about 2400° C. to about 2700° C. and wherein the process further comprises maintaining said heated silicon carbide crystal at a temperature ranging from about 2400° C. to about 2700° C. for up to about one hour in an inert ambient atmosphere.

27. The process of claim 26, wherein the heating step comprises heating the silicon carbide crystal to a temperature of about 2600° C. and wherein the process further comprises maintaining said heated silicon carbide crystal at a temperature of about 2600 ° C. for up to about one hour in an inert ambient atmosphere.

28. The process of claim 25, wherein the cooling step comprises cooling the heated silicon carbide crystal at a rate of about 2° C. per minute or less to a temperature of about 1400° C. to about 1000° C.

29. The process of claim 28, wherein the cooling step comprises cooling the heated silicon carbide crystal at a rate of about 2° C. per minute or less to a temperature of about 1200° C.

30. The process of claim 29, wherein the cooling step further comprises cooling the silicon carbide crystal from about 1200° C. to about room temperature at a rate from about 2° C. per minute to about 10° C. per minute.

31. A process for the production of a device comprising a silicon carbide crystal exhibiting increased minority carrier lifetime comprising heating a silicon carbide crystal having a first concentration of minority carrier recombination centers resulting in a first minority carrier lifetime and thereafter cooling the heated silicon carbide crystal at a rate sufficiently slow to provide a silicon carbide crystal having a second concentration of minority carrier recombination centers that is lower than the first concentration thereby providing a material having an increased minority carrier lifetime, wherein the heating and cooling steps comprise heating and cooling a silicon carbide crystal under conditions to provide a silicon carbide crystal exhibiting a minority carrier lifetime of at least about 30 microseconds ($\mu$s); and
incorporating said silicon carbide crystal into a device.

32. A process for producing silicon carbide crystals having increased minority carrier lifetimes, comprising:
growing at a growth temperature to form a silicon carbide crystal having a first concentration of minority carrier recombination centers resulting in a first minority carrier lifetime;
heating said silicon carbide crystal to a temperature greater than its growth temperature; and
thereafter cooling the heated silicon carbide crystal at a rate of about 2° C. per minute or less to provide a silicon carbide crystal having a second concentration of minority carrier recombination centers that is lower than the first concentration thereby providing a material having an increased minority carrier lifetime.

33. The process of claim 32, wherein said growing step comprising growing said silicon carbide crystal using sublimation techniques to form a bulk grown silicon carbide single crystal boule and wherein the heating step comprises heating a bulk grown silicon carbide single crystal boule to a temperature higher than the sublimation temperature of silicon carbide.

34. The process of claim 33, wherein the heating step comprises heating a bulk grown silicon carbide single crystal boule to a temperature of at least about 2400 ° C.

35. The process of claim 32, wherein said growing step comprising growing said silicon carbide crystal using chemical vapor deposition techniques to form one or more silicon carbide epitaxial layers and wherein the heating step comprises heating one or more silicon carbide epitaxial layers to a temperature higher than the temperature for epitaxial growth of said silicon carbide epitaxial layers.

36. The process of claim 35, wherein the heating step comprises heating said one or more silicon carbide epitaxial layers to a temperature above about 1600° C.

37. The process of claim 34, wherein the heating step comprises heating a bulk grown silicon carbide single crystal boule to a temperature of at least about 2600 ° C.

38. A process for producing silicon carbide crystals having increased minority carrier lifetimes, comprising:
growing at a growth temperature to form a silicon carbide crystal having a first concentration of intrinsic defects and a first minority carrier lifetime;
heating said silicon carbide crystal to a temperature that decreases the concentration of intrinsic defects; and
thereafter cooling the heated silicon carbide crystal at a rate sufficiently slow so that the silicon carbide crystal has a second concentration of intrinsic defects that is lower than the first concentration thereby providing a material having an increased minority carrier lifetime.

39. The process of claim 38, wherein:
said heating step comprises heating said silicon carbide crystal having a first concentration of intrinsic defects and a first minority carrier lifetime to a temperature sufficient to dissociate at least some of said intrinsic defects to decrease the concentration thereof; and
said cooling step comprises thereafter cooling the heated silicon carbide crystal at a rate sufficiently slow to reduce recombination of said dissociated intrinsic defects to provide a silicon carbide crystal having a second concentration of intrinsic defects that is lower than the first concentration thereby providing a material having an increased minority carrier lifetime.

40. The process of claim 39, wherein said cooling step is sufficiently slow to allow the silicon carbide crystal to spend sufficient time at a temperature at which the defects are re-annealed.

41. The process of claim 40, wherein the cooling step comprises cooling the silicon carbide crystal at a rate of about 2° C. per minute or less.

42. The process of claim 41, wherein said growing step comprising growing said silicon carbide crystal using sublimation techniques to form a bulk grown silicon carbide single crystal boule and wherein the heating step comprises heating a bulk grown silicon carbide single crystal boule to a temperature higher than the sublimation temperature of silicon carbide of at least about 2400° C.

43. The process of claim 41, wherein said growing step comprising growing said silicon carbide crystal using chemical vapor deposition techniques to form one or more silicon carbide epitaxial layers and wherein the heating step comprises heating one or more silicon carbide epitaxial layers to a temperature higher than the temperature for epitaxial growth of said silicon carbide epitaxial layers of above about 1600° C.

44. The process of claim 1, wherein the heating and cooling steps comprise heating and cooling a silicon carbide crystal under conditions sufficient to provide a silicon carbide crystal exhibiting a minority carrier lifetime of greater than 5 microseconds ($\mu$s).

45. The process of claim 1, wherein the heating and cooling steps comprise heating and cooling a silicon carbide crystal under conditions sufficient to provide a silicon carbide crystal exhibiting a minority carrier lifetime of about 20 microseconds ($\mu$s) or greater.

* * * * *